United States Patent
Ahn

(10) Patent No.: US 9,099,865 B2
(45) Date of Patent: Aug. 4, 2015

(54) DIGITAL PROTECTIVE RELAY

(71) Applicant: LSIS CO., LTD., Anyang-si, Gyeonggi-do (KR)

(72) Inventor: Hong Seon Ahn, Cheongju-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 135 days.

(21) Appl. No.: 13/850,998

(22) Filed: Mar. 26, 2013

(65) Prior Publication Data
US 2013/0265675 A1 Oct. 10, 2013

(30) Foreign Application Priority Data
Apr. 9, 2012 (KR) .................. 10-2012-0036915

(51) Int. Cl.
| H05K 7/14 | (2006.01) |
| H05K 7/18 | (2006.01) |
| H02H 7/20 | (2006.01) |
| H05K 1/02 | (2006.01) |
| H05K 1/14 | (2006.01) |

(52) U.S. Cl.
CPC ............... *H02H 7/20* (2013.01); *H05K 1/0218* (2013.01); *H05K 1/141* (2013.01); *H05K 1/0215* (2013.01); *H05K 2201/044* (2013.01); *H05K 2201/10295* (2013.01)

(58) Field of Classification Search
CPC ....... H05K 13/04; H05K 1/141; H05K 1/148; H05K 7/1457; H05K 7/1487
USPC .......... 361/799, 816, 818, 756, 727, 825, 826
See application file for complete search history.

(56) References Cited

U.S. PATENT DOCUMENTS

| 3,746,932 | A | | 7/1973 | Hogan et al. |
| 4,869,677 | A | * | 9/1989 | Johnson et al. ................. 439/80 |
| 4,997,390 | A | * | 3/1991 | Scholz et al. ................. 439/509 |
| 5,055,061 | A | * | 10/1991 | Lichtenwalter ............... 439/377 |
| 5,500,788 | A | * | 3/1996 | Longueville et al. ......... 361/800 |
| 5,708,552 | A | * | 1/1998 | Han et al. ...................... 361/799 |
| 6,231,391 | B1 | * | 5/2001 | Ramey et al. ............ 439/607.07 |
| 6,280,201 | B1 | | 8/2001 | Morris |
| 6,312,269 | B1 | | 11/2001 | Obata |
| 6,346,003 | B1 | * | 2/2002 | Vilgiate ......................... 439/377 |
| 6,435,913 | B1 | * | 8/2002 | Billman ..................... 439/607.1 |
| 6,735,093 | B2 | * | 5/2004 | Mu-Tsai ........................ 361/818 |
| 6,872,085 | B1 | * | 3/2005 | Cohen et al. .................. 439/108 |
| 8,218,324 | B2 | * | 7/2012 | Jones ............................. 361/752 |
| 8,279,075 | B2 | * | 10/2012 | Fleischman et al. .......... 340/652 |

FOREIGN PATENT DOCUMENTS

| EP | 2254196 | 11/2010 |
| WO | 2010087996 | 8/2010 |

OTHER PUBLICATIONS

European Patent Office Application Serial No. 13162528.7, Search Report dated Jan. 2, 2014, 6 pages.

* cited by examiner

*Primary Examiner* — Hung S Bui
(74) *Attorney, Agent, or Firm* — Lee, Hong, Degerman, Kang & Waimey

(57) ABSTRACT

A digital protective relay includes at least one daughter PCB having an electronic circuit which generates electromagnetic interference noise or high frequency noise; and a backplane printed circuit board having, on an upper surface thereof, a plurality of first connectors for connection with the daughter PCB, connected to the daughter PCB through the first connectors, and providing a noise discharge path along which the electromagnetic interference noise or the high frequency noise from the daughter PCB flows to an external ground.

3 Claims, 3 Drawing Sheets

DIGITAL PROTECTIVE RELAY

CROSS-REFERENCE TO RELATED APPLICATION

Pursuant to 35 U.S.C. §119(a), this application claims the benefit of earlier filing date and right of priority to Korean Application No. 10-2012-0036915, filed on Apr. 9, 2012, the contents of which is incorporated by reference herein in its entirety.

BACKGROUND OF THE INVENTION

1. Field of the Invention

The present disclosure relates to a digital protective relay, and particularly, to a ground configuration of a printed circuit board of a digital protective relay.

2. Background of the Invention

A digital protective relay refers to a relay for preventing the spreading of an electric accident by operating a circuit breaker when a fault current is detected in an electric power system. For instance, in a case where an electric accident such as a short circuit or an eddy current occurs on an electric circuit, the digital protective relay may control the circuit breaker to break the circuit where the accident has occurred, not to spread the electric accident.

In the conventional art, a printed circuit board (PCB) is grounded by installing a pin shaped contactor contactable to an enclosure at a guide rail of the PCB. However, such conventional grounding method has a problem that the enclosure of the digital protective relay should be formed of a metallic conductor.

As another conventional grounding method, there is a grounding method using a power supply module without forming a circuit pattern toward the ground on a printed circuit board. However, such method has a problem that grounding efficiency is lowered.

SUMMARY OF THE INVENTION

Therefore, an aspect of this disclosure is to provide a digital protective relay capable of effectively grounding a circuit board even if an enclosure of the digital protective relay is not formed of a conductor.

To achieve these and other advantages and in accordance with the purpose of this specification, as embodied and broadly described herein, there is provided a digital protective relay, comprising:

at least one daughter printed circuit board having an electronic circuit which generates electromagnetic interference noise or high frequency noise; and a backplane printed circuit board that has, on an upper surface thereof, a plurality of first connectors for connection with the daughter printed circuit board, connected to the daughter printed circuit board through the first connectors, and provides a noise discharge path along which the electromagnetic interference noise or the high frequency noise from the daughter printed circuit board flows to an external ground, wherein the backplane printed circuit board comprises:

a first ground conductor portion that is disposed on an outer edge thereof, and provides the noise discharge path by being electrically connected to the external ground; and plural pairs of ground channel pins that are disposed on the first ground conductor portion in a facing manner to each other in correspondence to the first connectors, and configured to receive the electromagnetic interference noise or the high frequency noise from the daughter printed circuit board by interposing the daughter printed circuit board therebetween.

According to another aspect of the present invention, the daughter printed circuit board comprises:

an electronic circuit;

a second connector to be connected to the first connector of the backplane printed circuit board; and a pair of second ground conductor portions that are disposed at upper and lower parts of the daughter printed circuit board, and configured to electrically connect the daughter printed circuit board to the backplane printed circuit board by being interposed between two pairs of ground channel pins of the backplane printed circuit board.

According to still another aspect of the present invention, the first ground conductor portion is connected to a ground pin of an enclosure of the digital protective relay, or a ground portion of a supporting frame for supporting the digital protective relay.

According to still another aspect of the present invention, the first ground conductor portion or the second ground conductor portion is configured as a copper lamination portion.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
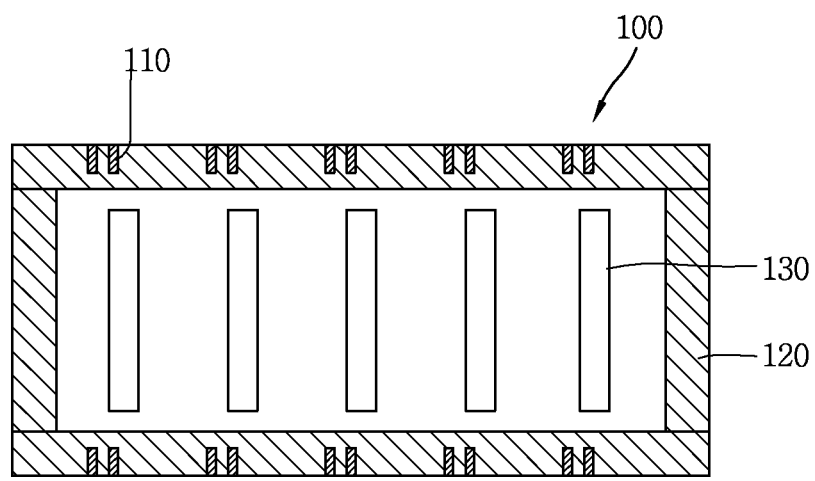
FIG. 1 is a planar view schematically showing a configuration of a backplane printed circuit board of a digital protective relay according to a preferred embodiment of the present invention.
Figure 2:
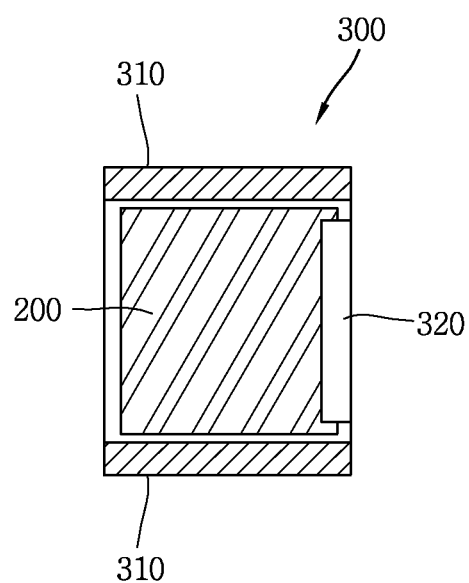
FIG. 2 is a frontal view schematically showing a configuration of a daughter printed circuit board of a digital protective relay according to a preferred embodiment of the present invention.
Figure 3:
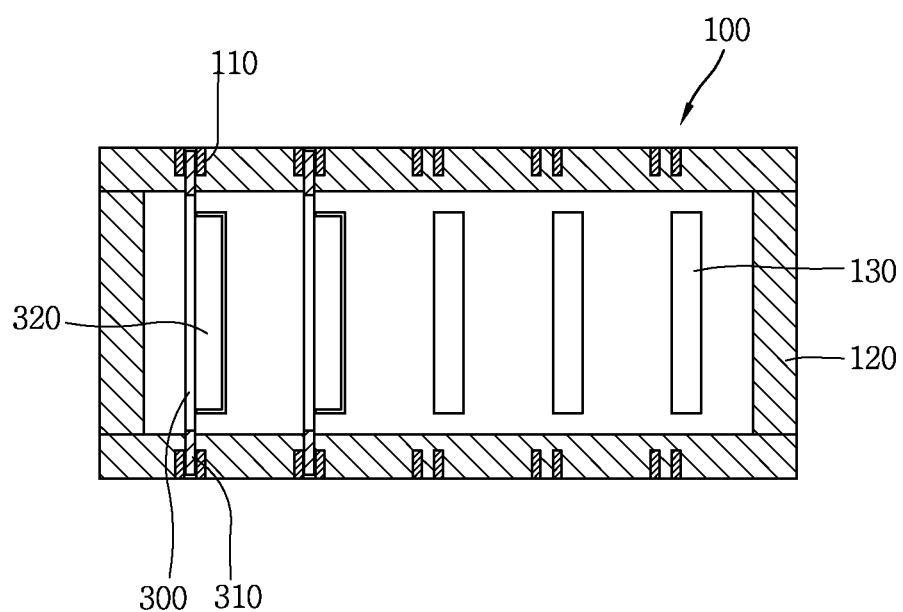
FIG. 3 is a planar view showing an assembled state of the backplane printed circuit board and the daughter printed circuit board of a digital protective relay according to a preferred embodiment of the present invention.

Referring to FIGS. 1 to 3, a digital protective relay according to the present invention includes a backplane printed circuit board (printed circuit board is abbreviated as PCB hereinafter) 100, and a daughter PCB 300.

The backplane PCB 100 indicates a large common circuit board which performs functions of a mother board. And, the daughter PCB 300 indicates a small subsidiary circuit board which performs its own function and inserted into the backplane PCB 100.

The daughter PCB 300 may be provided in at least one, (e.g., five) in number.

Referring to FIG. 2, the daughter PCB 300 includes an electronic circuit 200 for performing its own function, and the electronic circuit 200 generates high frequency noise or electromagnetic interference noise(so called as 'EMI') occurring between electronic components. Such electromagnetic interference noise or high frequency noise is unnecessary electric noise, which may cause a problem to an operation of a system including other device or the digital protective relay. The generated electromagnetic interference noise or high frequency noise is discharged to the ground, a reference potential, through a path having a smallest impedance. If there is no ground path, the electromagnetic interference noise may cause disturbance to the ground of the electronic circuit or a signal path, which may influence on a normal operation of the digital protective relay.

As shown in FIG. 1, the backplane PCB 100 has, on an upper surface thereof, a plurality of first connectors 130 for connection with the daughter PCB 300. As the backplane PCB 100 is connected to the daughter PCB 300 through the first connectors 130, the backplane PCB 100 provides a noise discharge path along which the electromagnetic interference noise or the high frequency noise from the daughter PCB 300 flows to the external ground.

In order to provide the noise discharge path, the backplane PCB 100 includes a first ground conductor portion 120, and plural pairs of ground channel pins 110.

The first ground conductor portion 120 is disposed on an outer edge of the backplane PCB 100, and may be disposed on four outer edges of the backplane PCB 100. According to a preferred embodiment, the first ground conductor portion 120 may be configured as a copper lamination portion.

The first ground conductor portion 120 may be connected to a ground pin (not shown) of an enclosure of the digital protective relay, or may be connected to a ground portion (not shown) of a supporting frame (not shown) for supporting the digital protective relay.

The plural pairs of ground channel pins 110 are disposed on the first ground conductor portion 120 in a facing manner to one another in correspondence to the first connectors 130. And, the plural pairs of ground channel pins 110 are configured to receive the electromagnetic interference noise or the high frequency noise from the daughter PCB 300 by interposing the daughter PCB therebetween.

As shown in FIG. 2, each daughter PCB 300 includes an electronic circuit 200, a second ground conductor portion 310 and a second connector 320.

As aforementioned, the electronic circuit 200 indicates an electronic circuit which performs individual function. The second connector 320 serves to provide a transmission path of an electrical signal by being connected to the first connector 130 of the backplane PCB 100. For instance, if the first connectors 130 are configured as pin connectors, the second connectors 320 may be configured as pin hole connectors for connecting the pin connectors, or vice versa.

The second ground conductor portion 310 may be configured as a pair of conductor portions disposed on left side and right side parts of the daughter PCB 300. According to a preferred embodiment, the second ground conductor portions 310 may be configured as copper lamination portions so called 'copper'. As shown on FIG. 3 two second ground conductor portions 310 of each daughter PCB 300 are inserted between two pairs of ground channel pins 110 of the backplane PCB 100, thereby electrically connecting the daughter PCB 300 to the backplane PCB 100.

Hereinafter, assembly processes of the backplane PCB 100 and the daughter PCB 300 will be explained. As shown in FIG. 3, the two second ground conductor portions 310 of the daughter PCB 300 are inserted between two pairs of ground channel pins 110 facing each other of the backplane PCB 100. At the same time, the second connectors 320 are connected to the first connectors 130 of the backplane PCB 100.

An operation to ground the circuit board of a digital protective relay according to the present invention will be explained with reference to FIG. 4 mainly, and FIGS. 1 to 3 subsidiarily. Here, FIG. 4 is a flowchart for explaining an operation to ground the circuit board of a digital protective relay according to a preferred embodiment of the present invention.

Figure 4:
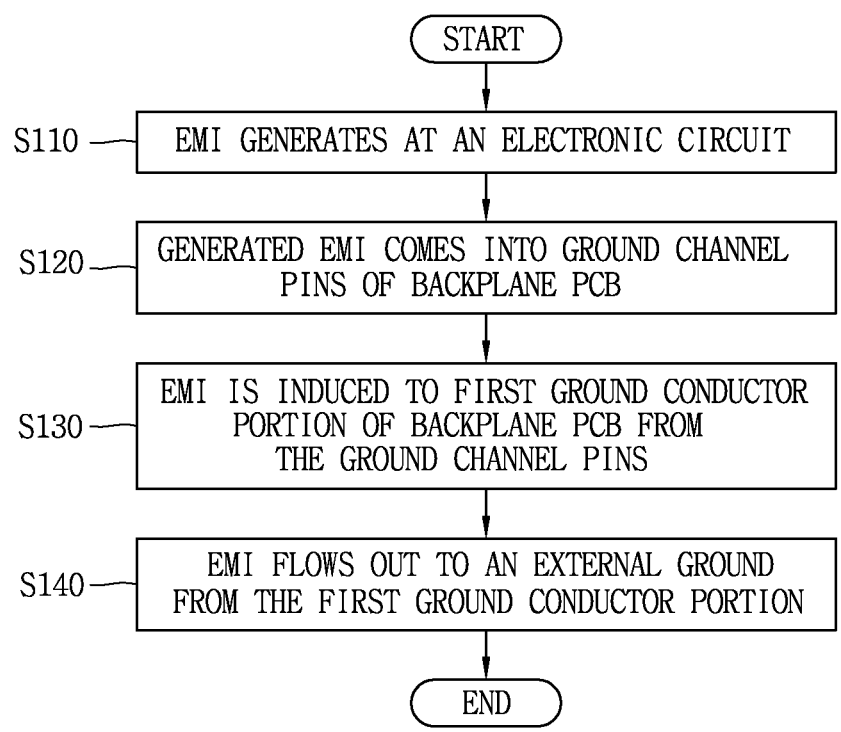
FIG. 4 is a flowchart for explaining an operation to ground a circuit board of a digital protective relay according to a preferred embodiment of the present invention.

Referring to FIG. 4, electromagnetic interference noise or high frequency noise is generated at the electronic circuit 200 of the daughter PCB 300 (S110).

Then, the electromagnetic interference noise or high frequency noise are generated at the electronic circuit 200 of the daughter PCB 300 are introduced to the ground channel pins 110 of the backplane PCB 100 through the second ground conductor portions 310 (S120).

More specifically, the generated electromagnetic interference noise or high frequency noise may be induced to the second ground conductor portions 310 of the electronic circuit 200 of the daughter PCB 300. Then, the electromagnetic interference noise or high frequency noise induced to the second ground conductor portions 310 comes into the ground channel pins 110 of the backplane

PCB 100.

Then, the electromagnetic interference noise or high frequency noise introduced to the ground channel pins 110 moves from the ground channel pins 110, through the first ground conductor portion 120 of the backplane PCB 100 (S130).

Here, the electromagnetic interference noise or high frequency noise generated at the backplane PCB 100 moves through the first ground conductor portion 120 directly.

Then, the electromagnetic interference noise or high frequency noise which moves through the first ground conductor portion 120, goes out to the external ground from the first ground conductor portion 120 (S140). As aforementioned, the external ground indicates the ground portion of the supporting frame for supporting the enclosure of the digital protective relay, or the ground pin of the digital protective relay.

The digital protective relay according to the present invention has the following advantages.

Firstly, electromagnetic interference noise or high frequency noise generated from the daughter PCB 300 or the backplane PCB 100 is induced to the first ground conductor portion 120 through the ground channel pins 110, and then is discharged to the external ground connected to the first ground conductor portion 120. Under such configuration, even if the enclosure of the digital protective relay is formed of a nonconductor material, electromagnetic interference noise or high frequency noise generated from the daughter PCB 300 or the backplane PCB 100 can be effectively discharged to the external ground.

Secondly, a connection length between the first ground conductor portion 120 and the external ground using the first ground conductor portion 120 of the backplane PCB 100, can be minimized. Accordingly, electromagnetic interference noise or high frequency noise generated at the inside circuit of the digital protective relay can be efficiently discharged. Further, as the electronic circuit 200 of the daughter PCB 300 can be protected from external noise using the first ground conductor portion 120 of the backplane PCB 100, the reliability of the product can be enhanced.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A digital protective relay, comprising:
   at least one daughter printed circuit board (PCB) having an electronic circuit that generates electromagnetic interference noise or high frequency noise; and
   a backplane PCB having a plurality of first connectors on an upper surface, the backplane PCB connected to the daughter PCB via the first connectors and providing a noise discharge path via which the electromagnetic interference noise or the high frequency noise flows to an external ground,
   wherein the backplane PCB comprises:
   a first ground conductor portion located on an outer edge and electrically connected to the external ground to provide the noise discharge path and
   a plurality of pairs of ground channel pins located on the first ground conductor portion and facing each other such that the at least one daughter PCB is interposed between them, the pairs of ground channel pins corresponding to the first connectors and configured to receive the electromagnetic interference noise or the high frequency noise,
   wherein the daughter PCB comprises:
   an electronic circuit;
   a second connector connected to at least one of the first connectors; and
   a pair of second ground conductor portions located at upper and lower parts of the daughter PCB such that they are interposed between two pairs of the plurality of pairs of ground channel pins and configured to electrically connect the daughter PCB to the backplane PCB.

2. The digital protective relay of claim 1, wherein the first ground conductor portion is connected to a ground pin of an enclosure of the digital protective relay or to a ground portion of a frame that supports the digital protective relay.

3. The digital protective relay of claim 1, wherein the first ground conductor portion or the pair of second ground conductor portions is configured as a copper lamination portion.

* * * * *